United States Patent
Kato et al.

(10) Patent No.: US 8,309,393 B2
(45) Date of Patent: Nov. 13, 2012

(54) METHOD OF PRODUCING A SINGLE-CRYSTAL THIN FILM OF AN ORGANIC SEMICONDUCTOR COMPOUND

(75) Inventors: Takashi Kato, Kanagawa (JP); Tatsuya Igarashi, Tokyo (JP); Toshihiro Shimada, Tokyo (JP); Yui Ishii, Tokyo (JP)

(73) Assignees: FUJIFILM Corporation, Tokyo (JP); The University of Tokyo, Tokyo (JP)

( * ) Notice: Subject to any disclaimer, the term of this patent is extended or adjusted under 35 U.S.C. 154(b) by 441 days.

(21) Appl. No.: 12/676,117

(22) PCT Filed: Aug. 26, 2008

(86) PCT No.: PCT/JP2008/065165
§ 371 (c)(1),
(2), (4) Date: Apr. 7, 2010

(87) PCT Pub. No.: WO2009/031434
PCT Pub. Date: Mar. 12, 2009

(65) Prior Publication Data
US 2010/0213448 A1    Aug. 26, 2010

(30) Foreign Application Priority Data
Sep. 3, 2007   (JP) .................................. 2007-228390

(51) Int. Cl.
*H01L 21/00* (2006.01)
(52) U.S. Cl. .... 438/99; 438/149; 438/780; 257/E29.151
(58) Field of Classification Search .................... 438/99, 438/149–167, 758, 780; 257/E29.151
See application file for complete search history.

(56) References Cited

U.S. PATENT DOCUMENTS

| | | | |
|---|---|---|---|
| 2003/0226996 A1* | 12/2003 | Aramaki et al. | 252/62.3 Q |
| 2006/0099732 A1* | 5/2006 | Miura et al. | 438/99 |
| 2010/0029041 A1* | 2/2010 | Aramaki et al. | 438/99 |

FOREIGN PATENT DOCUMENTS

| | | |
|---|---|---|
| JP | 2004-158815 A | 6/2004 |
| JP | 2005-216966 A | 8/2005 |
| JP | 2005-281011 A | 10/2005 |
| JP | 2005-328030 A | 11/2005 |
| JP | 2007-123580 A | 5/2007 |

OTHER PUBLICATIONS

Xiangdong Lu, et al.; "Inherent features in the growth of perylene crystals on an oil substrate"; Physical Review B; vol. 73, No. 3; Jan. 1, 2006; pp. 033405-1-033405-4; XP55029322.

Yui Ishii, et al., "Wetting-Dewetting Oscillations of Liquid Films during Solution-Mediated Vacuum Deposition of Rubrene", Langmuir, Jun. 5, 2007, pp. 6864-6868, vol. 23, No. 12.

Gao-Xiang Ye, et al., "Nucleation, Growth, and Aggregation of Ag Clusters on Liquid Surfaces", Physical Review Letters, Jul. 20, 1998, pp. 622-625, vol. 81, No. 3.

* cited by examiner

Primary Examiner — Brook Kebede
(74) Attorney, Agent, or Firm — Sughrue Mion, PLLC

(57) ABSTRACT

A method of producing a single-crystal thin film of an organic semiconductor compound, which contains the steps of: applying an organic solvent which has a dielectric constant of 4.5 or greater and in which an organic semiconductor compound is soluble, on a substrate, to form a liquid film of the organic solvent on the substrate; supplying the organic semiconductor compound into the liquid film of the organic solvent, to dissolve therein; and crystallizing the organic semiconductor compound in the organic solvent.

15 Claims, 2 Drawing Sheets

(a)

(b)

"結晶" means a crystal indicated by the arrow in the figure

METHOD OF PRODUCING A SINGLE-CRYSTAL THIN FILM OF AN ORGANIC SEMICONDUCTOR COMPOUND

TECHNICAL FIELD

The present invention relates to a method of producing a single-crystal thin film of an organic semiconductor compound. In more detail, the present invention relates to a method of producing a single-crystal thin film of an organic semiconductor compound in a large area and uniformly, and to a single-crystal thin film of an organic semiconductor compound produced by the method.

BACKGROUND ART

Thin films of organic semiconductor compounds are applied to functional materials for, for example, electro-optical devices, semiconductor devices, light-emitting devices, and laser media. Particularly in recent years, investigation of new functional materials expecting the diversity held by the organic semiconductor compounds is being discussed. For the purpose of favorably using the organic semiconductor compound as the functional material, it is preferable that the organic semiconductor compound is formed in the state of a thin film on a substrate onto which electrodes and the like are provided.

On the other hand, the organic semiconductor compound is used in a crystalline state or in an amorphous state. In general, the organic semiconductor compounds in the crystalline state have tendency of having high semiconductor characteristics such as mobility, but it is difficult to prepare the crystal with a large area and without any defect. Resultantly, under the current situation, there are many cases where the organic semiconductor compounds in the amorphous states are used.

Thus, necessity for preparing the organic semiconductor compound in the form of a highly crystalline thin film have raised.

Hitherto, as techniques for preparing thin films, some methods are proposed, including, for example, vacuum vapor deposition methods represented by a molecular beam epitaxy (MBE) method or a pulsed laser vapor deposition (PLD) method; a spin coat method, in which a solution prepared by adjusting the composition ratio of elements to be added is applied onto a substrate, followed by heating and drying; and an ink-jet method, in which such a solution is applied by ink-jet. Further, there are also proposed a technique of allowing a melt to change into a thin film by cooling slowly, and a technique of allowing the solution to change into a thin film by slowly evaporating a solvent therein or by cooling slowly.

However, since the highly crystalline thin film is obtained from the solution via crystal growth, it is difficult to prepare the highly crystalline thin film by merely applying the conventional vacuum vapor deposition method as it is. Further, it is difficult to control the film thickness with nanometer unit via the conventional spin coat method and ink-jet method, and the resultant film is non-uniform in thickness and moreover it is poor in crystallinity of the resultant thin film. Furthermore, it is difficult to control the film thickness via the conventional method for crystal growth from the melt or solution.

In recent years, a method is proposed, in which a precursor material applied on a substrate placed in a vacuum condition is sprayed with a solvent vapor, to evaporate and crystallize the precursor (for example, see Journal of Applied Physics, 2001, Vol. 90, No. 1, p. 209-212.). According to this method, since the solvent vapor is sprayed in vacuo, there is a merit that the concentration of the solvent vapor can be measured via its pressure.

Further, a method is proposed, in which a precursor material of a thin film to be prepared is adhered on a substrate, the solvent used for dissolving the precursor material is atomized to generate a solvent vapor, and the thus-generated solvent vapor is brought to contact with the precursor material, thereby to crystallize the precursor under the atmospheric pressure (for example, see JP-A-2005-281011 ("JP-A" means unexamined published Japanese patent application)). In this situation, crystallization of the precursor material is controlled by adjusting the concentration of the solvent vapor to generate. According to the method, the crystallization process can be carried out under the atmospheric pressure, and it is also possible to conduct patterning in a nano-sized order via the ink-jet technology.

Furthermore, a method is proposed, in which an organic solvent, in which an organic semiconductor compound is soluble, is applied on a substrate, to form a liquid film, the organic semiconductor compound is brought to adhere thereto by, for example, vapor deposition or sputtering, to have the compound take through the state that the compound is dissolved in the organic solvent, and then the organic solvent is evaporated, thereby to prepare a thin film of the organic semiconductor compound (for example, see Crystal Growth Des. 2003, Vol. 3, p. 125, and Physical Review letters, 1998, Vol. 81, No. 2, p. 622.).

However, according to those conventional methods, it is still difficult to produce the single-crystal thin film of the organic semiconductor compound in a large area and uniformly. For example, Physical Review letters, 1998, Vol. 81, No. 2, p. 622 reports that tetracene crystallizes as the organic semiconductor material in toluene, but the crystallized area of the thin film is small and the crystals do not distribute uniformly, and it is not necessarily in the satisfactory level.

Further, in the above method, in which an organic solvent, in which an organic semiconductor compound is soluble, is applied on a substrate, to form a liquid film, and then the organic semiconductor compound is brought to adhere thereto by, for example, vapor deposition or sputtering, there is a case where the surface of the organic solvent liquid film thus formed on the substrate waves, that is, so-called oscillatory phenomenon occurs, upon adhering the organic semiconductor compound on the substrate. When the oscillatory phenomenon occurs, defects tend to occur and the crystal growth direction tends to become random, upon the formation of crystals of the organic semiconductor, which results it impossible to stably produce the single-crystal thin film in a large area and uniformly (for example, see Langmuir, 2007, vol. 23, p. 6864, etc.). Langmuir, 2007, vol. 23, p. 6864 reports that it is presumed such an oscillatory phenomenon is involved in a contact angle between the substrate surface and the organic solvent, and that the oscillatory phenomenon can be suppressed when the contact angle is 30 degrees or smaller.

DISCLOSURE OF INVENTION

The present inventors, having studied intensively, have found that, in the method of producing a single-crystal thin film of an organic semiconductor compound, by applying an organic solvent, in which an organic semiconductor compound in interest is soluble, on a substrate, to form a liquid film, adhering the organic semiconductor compound in interest by, for example, vapor deposition or sputtering, followed by allowing the organic semiconductor compound grow in the organic solvent liquid film, thereby to produce a target single-crystal thin film of the organic semiconductor compound, a dielectric constant of the organic solvent has a quite large influence on formation of the single-crystal thin film of the organic semiconductor compound; and that when the organic solvent with a dielectric constant of 4.5 or greater is used, the oscillatory phenomenon can be suppressed and the single-crystal thin film can be obtained in a large area and uniformly, which are unexpected advantageous effects. The present invention has been attained based on the above findings.

According to the present invention, there is provided the following means:

[1] A method of producing a single-crystal thin film of an organic semiconductor compound, which comprises the steps of:

applying an organic solvent which has a dielectric constant of 4.5 or greater and in which an organic semiconductor compound is soluble, on a substrate, to form a liquid film of the organic solvent on the substrate;

supplying the organic semiconductor compound into the liquid film of the organic solvent, to dissolve therein; and crystallizing the organic semiconductor compound in the organic solvent.

[2] The method of producing a single-crystal thin film of an organic semiconductor compound as described in the above [1], wherein a single-crystal of the organic semiconductor compound is a tabular crystal at least with an aspect ratio of 2 or greater.

[3] The method of producing a single-crystal thin film of an organic semiconductor compound as described in the above [1] or [2], wherein the dielectric constant of the organic solvent is 6.5 or greater but 40 or smaller.

[4] The method of producing a single-crystal thin film of an organic semiconductor compound as described in any one of the above [1] to [3], wherein the organic solvent is a phthalate ester-based compound or a phosphate ester-based compound.

[5] The method of producing a single-crystal thin film of an organic semiconductor compound as described in any one of the above [1] to [4], wherein a film thickness of the liquid film of the organic solvent is from 100 nm to 100 μm.

[6] The method of producing a single-crystal thin film of an organic semiconductor compound as described in any one of the above [1] to [5], wherein the organic semiconductor compound is an aromatic hydrocarbon, a thiophene derivative, or an organometallic complex having a semiconductor characteristic.

[7] The method of producing a single-crystal thin film of an organic semiconductor compound as described in any one of the above [1] to [6], wherein the supplying of the organic semiconductor compound to the liquid film of the organic solvent is conducted by any one of vapor deposition, sputtering, or spraying by an electro-spraying method in the state of a solution.

[8] The method of producing a single-crystal thin film of an organic semiconductor compound as described in any one of the above [1] to [7], wherein a temperature in the crystallizing step is 0° C. or lower.

[9] The method of producing a single-crystal thin film of an organic semiconductor compound as described in any one of the above [1] to [8], wherein a contact angle of the organic solvent with respect to the substrate is 30 degrees or less.

[10] The method of producing a single-crystal thin film of an organic semiconductor compound as described in any one of the above [1] to [9], wherein the substrate has a function for controlling orientation.

[11] The method of producing a single-crystal thin film of an organic semiconductor compound as described in any one of the above [1] to [10], wherein the substrate is one on which a polyimide film is provided.

[12] The method of producing a single-crystal thin film of an organic semiconductor compound as described in the above [11], wherein the polyimide film is subjected to rubbing.

[13] The method of producing a single-crystal thin film of an organic semiconductor compound as described in any one of the above [1] to [9], wherein the substrate is one on which a polyvinyl alcohol or (meth)acrylic resin is provided.

[14] A single-crystal thin film of an organic semiconductor compound, which is prepared according to the method as described in any one of the above [1] to [13].

[15] A method of producing a transistor, comprising:

producing a single-crystal thin film of an organic semiconductor compound, on a substrate, by the method which comprises the steps of:

applying an organic solvent which has a dielectric constant of 4.5 or greater and in which the organic semiconductor compound is soluble, on a substrate on which a source electrode and a drain electrode are provided, to form a liquid film of the organic solvent on the substrate;

supplying the organic semiconductor compound into the liquid film of the organic solvent, to dissolve therein; and crystallizing the organic semiconductor compound in the organic solvent; and providing a gate electrode, (a) on the single-crystal thin film of the organic semiconductor compound, or (b) on one surface of the substrate opposite to the other surface on which the single-crystal thin film of the organic semiconductor compound is formed.

Other and further features and advantages of the invention will appear more fully from the following description, appropriately referring to the accompanying drawing.

BEST MODE FOR CARRYING OUT INVENTION

Figure 1:
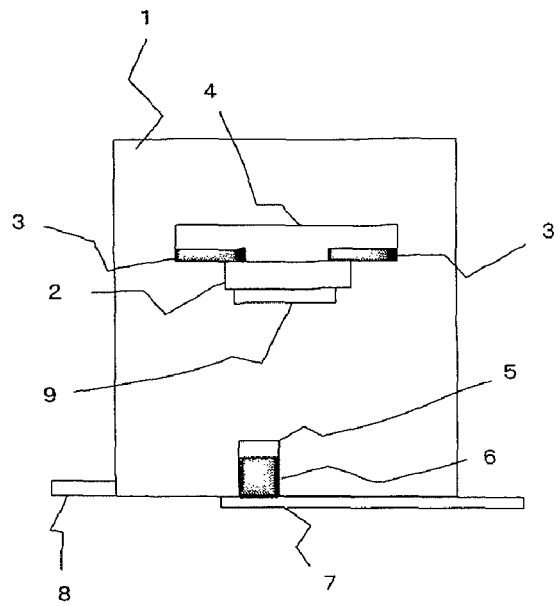
FIG. 1 is a schematic diagram illustrating a structure of one example of a production apparatus of the single-crystal thin film employing one preferred embodiment of the method of producing the single-crystal thin film of the organic semiconductor compound according to the present invention.

The present invention is explained below in further details.

The present invention provides a method of producing a single-crystal thin film of an organic semiconductor compound, which comprises: (1) the step of applying an organic solvent which has a dielectric constant of 4.5 or greater and in which an organic semiconductor compound is soluble, on a substrate, to form a liquid film of the organic solvent on the substrate; (2) the step of supplying the organic semiconductor compound into the liquid film of the organic solvent, to dissolve therein; and (3) the step of crystallizing the organic semiconductor compound in the organic solvent.

(1) The Step for Forming the Liquid Film of the Organic Solvent

In the present invention, a specific organic solvent is firstly applied on a substrate, to form the liquid film of the organic solvent (which is also referred to as an oil film, hereinbelow).

Regarding the organic solvent, one in which the organic semiconductor compound can be dissolved is used. It is for the purpose of achieving crystal growth of the organic semiconductor compound by dissolving it into the organic solvent. The phrase "can be dissolved (or soluble)" means that a solubility is 0.0001% by mass or greater at the room temperature and under the atmospheric pressure. The solubility of the organic semiconductor compound with respect to the organic solvent is preferably from 0.001 to 10% by mass, and more preferably from 0.01 to 5% by mass. Further, it is preferable that the supersaturation of the organic semiconductor compound with respect to the organic solvent is high, from the viewpoint that a single crystal with a large size can be obtained.

Further, the boiling point of the organic solvent is preferably from 20 to 500° C., and more preferably from 25 to 400° C. When the boiling point is too low, the organic solvent will evaporate during a vapor deposition stage in the case of assuming a process of supplying the organic semiconductor compound into the organic solvent by the vapor deposition, resulting in difficulty of achieving crystal growth of the organic semiconductor compound by dissolving it into the organic solvent, which is unfavorable.

Regarding the organic solvent, one having a dielectric constant of 4.5 or greater is used. The organic solvent with a dielectric constant of 4.5 or greater has a solubility of the organic semiconductor compound within an appropriate range, and the usage of such the organic solvent suppresses waving of the surface of the organic solvent liquid film on the substrate formed by adhering the organic semiconductor compound onto the substrate, that is, so-called oscillatory phenomenon, thereby enabling to allow crystal growth of the organic semiconductor compound uniformly, to obtain the single-crystal thin film in a large area uniformly and effectively. Although the reason why has not been clarified yet, it is presumed that since the organic solvent with a high dielectric constant has an appropriate interaction to both the substrate and the organic semiconductor compound, the production process of the single-crystal thin film on the substrate interface becomes readily and a balance between the single crystallization rate and the dissolution rate of the organic semiconductor compound can be balanced appropriately.

The dielectric constant of the organic solvent is preferably from 5.0 to 40, more preferably from 6.5 to 40, and further more preferably from 6.5 to 30. When the dielectric constant is below 4.5, the solubility of the organic semiconductor compound is low and the oscillatory phenomenon of the oil thin film occurs, which results to tend to cause defects in crystallization, and to make it difficult to obtain a favorable single-crystal thin film. For example, when toluene whose dielectric constant is 2.4 is used, there is a tendency of having a difficulty in obtaining the single crystal, since the solubility of the organic semiconductor compound in heating is low, the wettability to the substrate is low, and the oscillatory phenomenon of the thin film occurs resulting in generation of fine crystals. Further, when diphenyl ether whose dielectric constant is 3.9 is used, there is also a tendency of having a difficulty in obtaining the single crystal, since the wettability to the substrate tends to be low, and the difference of the solubility between at a high temperature and at a low temperature is small. When dibromopropane whose dielectric constant is 4.3 is used, although the situation is improved comparing with when toluene of dielectric constant 2.4 is used, there is also a tendency of having a difficulty in obtaining the single crystal without any defects, since the oscillatory phenomenon of the thin film still occurs resulting in generation of fine crystals. As described in the above, when the dielectric constant is below 4.5, there is no material satisfying all the necessary requirements for producing the uniform single-crystal thin film that the solubility of the organic semiconductor compound is within the range suitable for producing the single crystal, that the wettability to the substrate is favorable, and that the oscillatory phenomenon of the thin film does not occur. On the other hand, when the dielectric constant is too large, there is also a tendency of having a difficulty in obtaining the single-crystal thin film, since the solubility of the organic semiconductor compound rather decreases. In particular, when the dielectric constant is 50 or greater, there is a case where the solubility decreases since the compatibility with the organic semiconductor compound becomes poor.

As the organic solvent that can be used in the present invention, use may be preferably made of halogen-containing hydrocarbons, ester-based compounds, ether-based compounds, cyano-based compounds, ketone-based compounds, amino-based compounds, alcohol-based compounds, carboxylic acid-based compounds, amide-based compounds, heterocycle-based compounds, and phosphate-based compounds. The preference is given with the ester-based compounds having 1 to 100 carbon atoms or the phosphate-based compounds having 1 to 100 carbon atoms. The more preference is given with the ester-based compounds having 1 to 100 carbon atoms and having an alkyl group having 1 to 50 carbon atoms, or the phosphate-based compounds having 1 to 100 carbon atoms and having an alkyl group having 1 to 50 carbon atoms. Preferable compounds are adipic acid ester-based compounds, phthalic acid ester-based compounds or phosphoric acid ester-based compounds; and further preferable compounds are phthalic acid ester-based compounds or phosphoric acid ester-based compounds.

Specific examples of the organic solvent that can be used in the present invention include, for example, chloroheptane (dielectric constant: 5.5), chlorooctane (dielectric constant: 5.1), chlorotoluene (dielectric constant: 4.7), bromoheptane (dielectric constant: 5.3), dimethoxybenzene (dielectric constant: 4.5), acetonitrile (dielectric constant: 37.5), acetophenone (dielectric constant: 17.3), amyl alcohol (dielectric constant: 15.8), dimethylamine (dielectric constant: 6.3), methyl phthalate (dielectric constant: 8.5), ethyl phthalate, propyl phthalate, butyl phthalate (dielectric constant: 6.4), pentyl phthalate, hexyl phthalate (dielectric constant: 6.6), heptyl phthalate, octyl phthalate (dielectric constant: 5.1), nonyl phthalate, 2-ethylhexyl phthalate (dielectric constant: 6.6), trimethyl phosphate (dielectric constant: 21), triethyl phosphate (dielectric constant: 11), tripropyl phosphate, tributyl phosphate (dielectric constant: 8.3), tripenthyl phosphate, trihexyl phosphate, trihepthyl phosphate, trioctyl phosphate, tridecyl phosphate, tri(2-ethylhexyl) phosphate (dielectric constant: 7.0), and the like.

The substrate that can be used in the present invention is not particularly limited, and use may be made, for example, of a glass substrate, a metal substrate, a ceramics or polymer film, and the like. Specific examples of the polymer film include, for example, polyethylene terephthalate (PET), polyethylene naphthalate (PEN), polyethersulfone (PES), polycarbonate (PC), and the like. When the substrate is composed of a dielectric material, such as indium tin oxide (ITO), the organic solvent with a higher dielectric constant is preferable since it easily has affinity with the substrate.

Further, the thickness of the substrate is not particularly limited, and it is generally from 0.01 to 100 mm, and preferably from 0.1 to 10 mm.

Further, regarding the contact angle (wettability) of the organic solvent to the substrate, it is presumed that the contact angle between the organic solvent and the substrate participates in oscillatory phenomenon in conventional studies, and the smaller contact angle enables to suppress the oscillatory phenomenon. The contact angle of the organic solvent to the substrate is preferably 30 degrees or smaller, more preferably from 0 to 30 degrees, and further preferably from 0 to 25 degrees. The contact angle varies depending on the surface state of the substrate even if the organic solvent is the same.

The surface of the substrate may be subjected to a surface treatment, for the purpose of improving its wettability with the oil thin film. For example, in the case of a glass substrate, it can be subjected to the surface treatment using a silane coupling agent, and in the case of a polymer film, it can be subjected to the surface treatment of ozonization.

Further, another thin film may be formed in advance onto the substrate, for the purpose of improving its wettability with the oil thin film. Such the thin film may be any of an inorganic thin film, an organic thin film, or an inorganic-organic hybrid thin film. Regarding the organic thin film, polyvinyl alcohol and polyimide are preferably used. Acrylic-based resin or methacrylic-based resin may be used, instead of the polyvinyl alcohol. Further, an electrically conductive thin film may be provided. Examples of the electrically conductive thin film include gold, silver, copper, aluminum, indium tin oxide (ITO) being a transparent electrode material, zinc oxide, indium zinc oxide (IZO), carbon nanotube, an electrically conductive polymer (for example, poly(3,4-ethylenedioxythiophene)/poly(styrene sulfonate) (PEDOT/PSS)), and the like. The film thickness of these thin films is not particularly limited, but it is preferably from 1 nm to 1,000 μm, and more preferably from 5 nm to 100 μm.

Further, it is possible to add, on the substrate, a function for controlling of the molecular sequence (orientation) in the single crystal of the organic semiconductor compound, for the purpose of controlling the molecular sequence. Regarding such means, for example, a rubbing treatment after forming a polyimide thin film can be preferably used.

The organic solvent liquid film (oil thin film) is formed, by applying the organic solvent on the substrate. The applying/coating manner is not particularly limited, and, for example, a spin coating method, an ink-jet method, a screen printing method, an electrically spraying method, or so, can be employed.

The thickness of the organic solvent liquid film is generally within the range of from 1 nm to 1 mm, and preferably within the range of from 100 nm to 100 μm. Regarding the oil thin film, it is necessary that the organic semiconductor compound dissolves therein, and that the formation of the single crystal of the organic semiconductor compound progresses. Further, it is preferable that the oil thin film does not deteriorate, in the formation process for the single crystal of the organic semiconductor compound.

(2) The Step for Supplying the Organic Semiconductor Compound

Next to the above step, the organic semiconductor compound is supplied to the organic solvent liquid film formed onto the substrate, to dissolve the organic semiconductor compound in the organic solvent.

Regarding the organic semiconductor compound that can be used in the present invention, any organic compound showing semiconductor characteristic may be used, and the preference is given with an aromatic hydrocarbon compound, a heterocyclic compound, or an organometallic complex having semiconductor characteristic. An aromatic hydrocarbon, a thiophene derivative, or the organometallic complex having semiconductor characteristic are more preferable.

The organic semiconductor compound that can be used in the present invention may be either a p-type or an n-type. Specific examples of the p-type organic semiconductor compound include, for example, pentacenes, rubrenes, oligothiophenes, and phthalocyanines, each of which is substituted or unsubstituted. Further, the organic semiconductor materials, as described in Chemical Review, Vol. 107, pages 953-1010, 2007, are also preferably used. For the purpose of obtaining high mobility, any of the above pentacene, rubrene and oligothiophene are particularly preferable.

Specific examples of the n-type organic semiconductor compound include, for example, fullerenes, perylenes, phthalocyanines, each of which is substituted with an electron-withdrawing group, such as a fluorine atom.

Further, a p-n junction-type device prepared by laminating the p-type organic semiconductor compound crystal and the n-type organic semiconductor compound crystal may be favorably utilized.

A method of introducing the organic semiconductor compound into the organic solvent liquid film is not particularly limited. Examples thereof include, for example, depositing, sputtering, or laser vaporization of the organic semiconductor compound, onto the organic solvent liquid film formed on the substrate; and spraying of the organic semiconductor compound that has been made in a solution state, by an electrically spraying method. Alternatively, a solution that has been prepared in advance by allowing the organic semiconductor compound and the organic solvent to mix each other, may be applied to the substrate.

Further, when the organic semiconductor compound is introduced into the organic solvent liquid film by the vacuum vapor deposition method, oxygen can be suppressed from being doped into the crystal thin film.

(3) The Step for Crystallizing

Next to the above step, the single-crystal thin film of the organic semiconductor compound is prepared, by crystallizing the organic semiconductor compound in the organic solvent.

The temperature for carrying out the process for preparing the single-crystal thin film in the present invention for achieving the crystal growth of the organic semiconductor compound in the organic solvent, is preferably a low temperature of 25° C. or less (more preferably from −100° C. to 25° C.), and further preferably 0° C. or less (further preferably from −78° C. to 0° C.). By carrying out the crystallization step at such a low temperature, the favorable single-crystal thin film can be formed more efficiently. The reason why has not been clarified yet, but it is presumed as follows. Namely, at a high temperature, a diffusing force of the organic semiconductor material becomes relatively strong. This may be presumed to cause that seeds of the single crystal are formed at many places, to cause crystal growth in random directions, resulting in the formation of many interfaces in different crystal axes. In this way, a crystal thin film is formed, which has a small aspect ratio with respect to the interface and which has many defects. On the contrary, it is presumed in the below. As the temperature lowers, the crystal generation process and the diffusion process of the organic semiconductor single crystal are favorably balanced. As a result, the crystal growth in a specific direction (the horizontal direction with respect to the substrate) becomes possible, which is advantageous, thereby enabling to obtain the single-crystal thin film in a large area uniformly and efficiently, without causing any defects.

Furthermore, in the production process of the present invention for the single-crystal thin film, an electric field, a magnetic field, a light, or a polarized light may be applied/radiated from the outside, for controlling the arrangement of the single crystal to grow.

It is preferable that the organic solvent liquid film is removed, after the single-crystal thin film of the organic semiconductor compound is formed. Regarding the method for the removal, distillation under vacuum or removal by a physical method may be applied to.

Depending on the case, the organic solvent liquid film may remain just as it is. Alternatively, it is also an acceptable state in which the oil thin film (9) component remains in an ultra-trace amount. It is difficult to completely remove the oil thin film (9) component, in a usual manner. Thus, it becomes possible to know whether the single-crystal thin film of the organic semiconductor compound is produced according to the method of the present invention or not, by conducting microanalysis of the oil component in the single-crystal thin film of the organic semiconductor compound.

The thickness of the single-crystal thin film of the organic semiconductor compound produced according to the present invention, is generally within the range of from 1 nm to 1 mm, and preferably within the range of from 100 nm to 100 μm.

Further, it is preferable that the single crystal of the organic semiconductor compound produced according to the present invention, is a tabular crystal, and that the aspect ratio (the longest distance/thickness, when the single crystal is projected from just the upside of the substrate) is preferably 2 or greater (more preferably 2 or greater but 1,000 or smaller), and more preferably 5 or greater (further preferably 5 or greater but 100 or smaller). It is preferable that the aspect ratio is 2 or greater, since a long-axis of the single crystal becomes readily be arranged horizontally with respect to the substrate, and, as a result, it becomes possible to produce a functional device in which the arrangement of the organic semiconductor compound is controlled, i.e., a functional device using the organic semiconductor compound and exhibiting a high performance.

A preferred embodiment of the present invention will hereinafter be described in detail, with reference to the attached drawings.

FIG. 1 is a schematic diagram illustrating one example of a production apparatus of the thin film. The production apparatus 1 for the thin film, as illustrated in FIG. 1, is composed of a susceptor 4 for fixing a substrate 2, a heater 7 for heating a sublimation crucible 5 placing an organic semiconductor compound (organic semiconductor material) 6, and an exhaust port 8 for making the pressure of the inside of the production apparatus 1 for the thin film to a vacuum state. It is preferable that a Peltier device 3 is mounted onto the susceptor 4, for the purpose of controlling the temperature of the substrate 2, as illustrated.

At first, the substrate 2 prepared by forming an organic solvent liquid film (oil thin film) 9 by applying a specific organic solvent on the substrate 2, is set on the susceptor 4 in the production apparatus 1 of the thin film. On the other hand, the organic semiconductor compound 6 is placed in the sublimation crucible 5, and the sublimation crucible 5 is set to a predetermined position.

Then, the inside of the production apparatus 1 of the thin film is made to a vacuum state by exhausting the air from the exhaust port 8 using a suction pump or so, and the organic semiconductor compound 6 is sublimated by heating the sublimation crucible 5 using a heater 7, and the organic semiconductor compound 6 is deposited onto the organic solvent liquid film 9.

The thus-deposited organic semiconductor compound 6 is dissolved into the organic solvent liquid film 9, to cause crystal growth thereof in the organic solvent liquid film 9.

In this way, the single-crystal thin film of the organic semiconductor compound 6 can be produced.

According to the present invention, it is possible to form the single-crystal thin film from the organic semiconductor material, which is difficult to produce a thin film thereof high in crystallinity via the conventional method, such as the vacuum deposition method.

The single-crystal thin film material of the organic semiconductor compound produced according to the method of the present invention, can be applied to usages of the semiconductor material, and examples of the application include, for example, transistors, diodes, light guides, organic LED's, semiconductor lasers, solar cells, photodiodes, phototransistors, and the like.

When the single-crystal thin film of the organic semiconductor compound according to the present invention is utilized in the transistor, it is preferable that a substrate source electrode, a drain electrode, and a gate electrode are provided thereon. Specifically, after producing the single-crystal thin film of the organic semiconductor compound using a substrate onto which a source electrode and a drain electrode are mounted, a gate electrode should be further mounted (a) on the single-crystal thin film of the organic semiconductor compound, or (b) on the surface opposite to the surface where the single-crystal thin film of the organic semiconductor compound is formed on the substrate, thereby enabling to fabricate a transistor.

Figure 2:
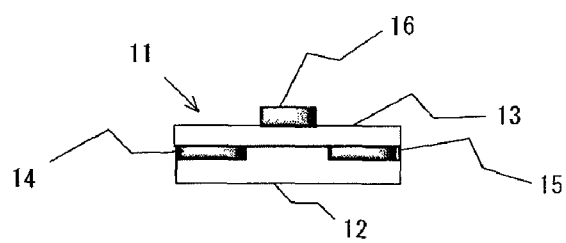
FIGS. 2(*a*) and 2(*b*) are schematic diagrams each illustrating one preferred embodiment of a thin film transistor utilizing the single-crystal thin film of the organic semiconductor compound according to the present invention.
Figure 2:
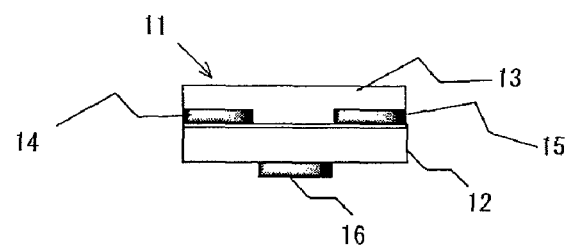

FIG. 2(*a*) and FIG. 2(*b*) illustrate preferred embodiments of the transistors produced according to the production method of the present invention.

FIG. 2(*a*) is a schematic diagram illustrating a transistor 11 of a type having a source electrode 14 and a drain electrode 15 between a substrate 12 and a single-crystal thin film 13 of the organic semiconductor compound, and being provided with a gate electrode 16 on the single-crystal thin film 13 of the organic semiconductor compound. Further, FIG. 2(*b*) is a schematic diagram illustrating a transistor 11 of a type having a source electrode 14 and a drain electrode 15 between a substrate 12 and a single-crystal thin film 13 of the organic semiconductor compound, and being provided with a gate electrode 16 on one surface of the substrate 12 opposite to the other surface on which a single-crystal thin film 13 of the organic semiconductor compound is formed. Herein, the same numerical symbols are allocated to the same elements in the explanation of each diagram. Further, an electrically insulating film may be provided on the gate electrode 16. Regarding the gate insulating film, those with high dielectric constant and with low electric conductance are preferable. Examples thereof include silicon oxide, silicon nitride, aluminums oxide, titanium oxide, tantalum oxide, polyethylene, polyimide, and the like.

According to the method of the present invention, a single-crystal thin film of an organic semiconductor compound can be produced in a large area uniformly, and it becomes possible to produce the single-crystal thin film of a large area with a given thickness by the inexpensive and efficient method.

Further, the single-crystal thin film of the organic semiconductor compound produced according to the method of the present invention, is a uniform single-crystal thin film with a large area and without any defects, which is excellent in the semiconductor characteristic, such as mobility.

EXAMPLES

The present invention will be described in more detail based on the following examples. The materials, reagents, amounts and ratios of substances to be used, operations, and other conditions, as shown in the following examples can be modified or changed arbitrarily, unless departing from the spirit and scope of the present invention. Thus, the scope of the present invention is not intended to be limited by any of the following specific examples.

Example 1

A glass substrate (10 mm square, manufactured by EHC) provided with ITO, which is a transparent electrode, was coated with bis(2-ethylhexyl) phthalate (dielectric constant 6.6, contact angle 21 degrees with respect to the ITO substrate), by a spin coating method (3,000 rpm), to prepare an organic solvent liquid film with thickness 10 μm. The glass substrate on which the organic solvent liquid film was formed was placed in a chamber of a vacuum vapor deposition apparatus.

Then, rubrene (manufactured by Sigma Aldrich Japan) was placed in a sublimation crucible, followed by subjecting to vacuum vapor deposition for 2 hours. The conditions in this vapor deposition were the degree of vacuum $1\times10^{-3}$ Pa, the heating temperature of a heater 180° C., and the vapor deposition rate 5 nm/minute. The temperature of the glass substrate was 25° C. at this treatment.

Taking out the resultant glass substrate having the organic solvent liquid film from the chamber, observation by microscope was carried out, to confirm a rubrene single-crystal thin film formed on the glass substrate. The resultant single crystal was approximately circular, the average diameter was 15 μm, the thickness was 5 μm, and the aspect ratio was 3.

Example 2

A rubrene single-crystal thin film was prepared in the same manner as in Example 1, except that the temperature of the glass substrate provided with ITO was changed to −10° C.

Conducting microscope observation of the resultant single-crystal thin film, it was confirmed that the resultant single crystal was approximately circular, the average diameter was 50 μm, the thickness was 5 μm, and the aspect ratio was 10. From this result, it is understood that by producing the single-crystal thin film under a lower temperature, the single-crystal thin film with a larger aspect ratio can be formed.

Example 3

A rubrene single-crystal thin film was prepared in the same manner as in Example 1, except that the substrate was replaced to a plain glass substrate.

As a result, the single-crystal thin film was obtained, which was similar to that obtained in Example 1. The resultant single crystal was approximately circular, the average diameter was 15 μm, the thickness was 5 μm, and the aspect ratio was 3.

Example 4

A rubrene single-crystal thin film was prepared in the same manner as in Example 2, except that the substrate was replaced to a plain glass substrate.

As a result, approximately the similar single-crystal thin film was obtained. The resultant single crystal was approximately circular, the average diameter was 40 μm, the thickness was 5 μm, and the aspect ratio was 8.

Example 5

A rubrene single-crystal thin film was prepared in the same manner as in Example 1, except that the organic solvent was replaced to tri(2-ethylhexyl) phosphate (dielectric constant 7.0, contact angle 20 degrees with respect to the ITO substrate).

The resultant single crystal was approximately circular, the average diameter was 25 μm, the thickness was 5 μm, and the aspect ratio was 5.

Comparative Example 1

A rubrene single-crystal thin film was tried to prepare in the same manner as in Example 1, except that the organic solvent was replaced to toluene (dielectric constant 2.38, contact angle 5 degrees with respect to the ITO substrate). However, no single-crystal was obtained, but an amorphous thin film was obtained.

Comparative Example 2

A rubrene single-crystal thin film was tried to prepare in the same manner as in Example 1, except that the organic solvent was replaced to liquid paraffin (dielectric constant 2.3, contact angle 45 degrees with respect to the ITO substrate). However, no single-crystal was obtained, but an amorphous thin film was obtained.

Comparative Example 3

A rubrene single-crystal thin film was tried to prepare in the same manner as in Example 1, except that the organic solvent was replaced to dibromopropane (dielectric constant 4.3). However, no single-crystal was obtained, but a fine crystal thin film was obtained.

Example 6

A single-crystal thin film was prepared in the same manner as in Example 1, except that the organic semiconductor material was replaced to pentacene.

The resultant single crystal was parallelogram, the average diameter was 20 μm, the thickness was 4 μm, and the aspect ratio was 5.

Example 7

A single-crystal thin film was prepared in the same manner as in Example 2, except that the substrate was replaced to a substrate prepared by applying a polyimide horizontally-oriented film (manufactured by Nissan Chemical Industries, Ltd., trade name, SE-130) on the glass substrate provided with ITO, followed by baking (at 200° C., for 1 hour, the final film thickness 100 nm).

As a result, a single-crystal thin film in a large area and having a larger aspect ratio was possible to obtain, similarly to Example 2.

Example 8

A single-crystal thin film was prepared in the same manner as in Example 2, except that the substrate was replaced to a substrate prepared by applying (the final film thickness 100 nm) a polymethyl methacrylate film (manufactured by Wako Pure Chemical Industries, Ltd., molecular weight 10,000) on the glass substrate provided with ITO.

As a result, a single-crystal thin film in a large area and having a larger aspect ratio was possible to obtain, similarly to Example 2.

Example 9

A single-crystal thin film was prepared in the same manner as in Example 2, except that the substrate was replaced to a substrate prepared by applying (the final film thickness 100 nm) a polyvinyl alcohol film (manufactured by Wako Pure Chemical Industries, Ltd., molecular weight 10,000, saponification degree 100%) on the glass substrate provided with ITO.

As a result, a single-crystal thin film in a large area and having a larger aspect ratio was possible to obtain, similarly to Example 2.

Example 10

A single-crystal thin film was prepared in the same manner as in Example 1, except that the substrate was replaced to a substrate prepared by vapor depositing gold on a glass substrate (substrate surface: gold (111) plane).

Figure 3:
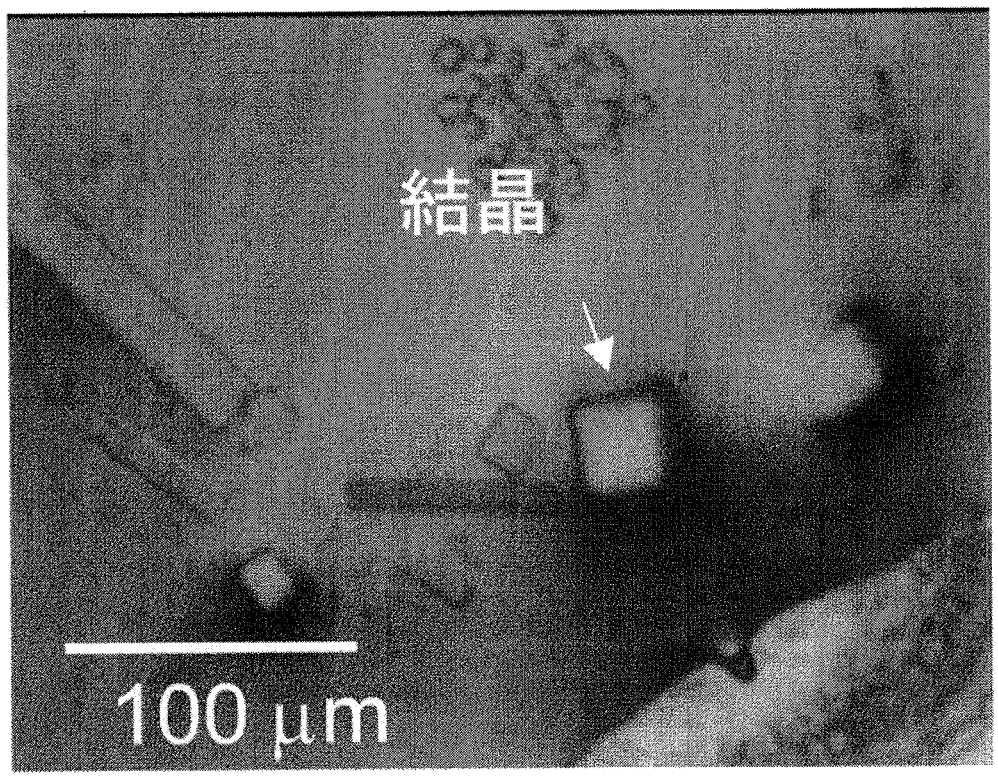
FIG. 3 is a microphotograph of a rubrene single crystal obtained in Example 10.

Taking out the resultant substrate having the organic solvent liquid film from the chamber, observation by microscope was carried out, to confirm a rubrene single-crystal thin film formed on the substrate. The photomicrograph is shown in FIG. 3. FIG. 3 is a photomicrograph showing the single crystal formed in the organic solvent liquid film. Please note that the lower right portion in FIG. 3 shows a region where no organic solvent liquid film is present. As is apparent from FIG. 3, the resultant single crystal was rectangle, and the length of a side was 25 µm. Further, from the shadow of the edge of the single crystal in the photograph, it is understood that, with respect to the thus-obtained single crystal, the thickness was 5 µm, and the aspect ratio was 5.

As is apparent from the results in the above-mentioned Examples and Comparative examples, not any single-crystal thin films but the amorphous thin films were obtained in Comparative Examples 1 and 2 in each of which the thin film formation was carried out using the organic solvent whose dielectric constant was less than 4.5. Contrary to the above, the single-crystal thin films in large areas and having larger aspect ratios were possible to obtain efficiently in Examples 1 to 10 in each of which the thin film formation was carried out using the organic solvent whose dielectric constant was 4.5 or greater.

The resultant single-crystal thin films can be taken out from the organic solvent liquid films, and can be used to fabricate devices. It is known that the size of the general-purpose transistors is from 1 to 5 µm. Thus, it is understood that the organic semiconductor single-crystal thin film obtained according to the present invention has a sufficient large area to cover such the transistors.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A method of producing a single-crystal thin film of an organic semiconductor compound, which comprises the steps of:
   applying an organic solvent which has a dielectric constant of 4.5 or greater and in which an organic semiconductor compound is soluble, on a substrate, to form a liquid film of the organic solvent on the substrate;
   supplying the organic semiconductor compound into the liquid film of the organic solvent, to dissolve therein; and
   crystallizing the organic semiconductor compound in the organic solvent.

2. The method of producing a single-crystal thin film of an organic semiconductor compound as claimed in claim 1, wherein a single-crystal of the organic semiconductor compound is a tabular crystal at least with an aspect ratio of 2 or greater.

3. The method of producing a single-crystal thin film of an organic semiconductor compound as claimed in claim 1, wherein the dielectric constant of the organic solvent is 6.5 or greater but 40 or smaller.

4. The method of producing a single-crystal thin film of an organic semiconductor compound as claimed in claim 1, wherein the organic solvent is a phthalate ester-based compound or a phosphate ester-based compound.

5. The method of producing a single-crystal thin film of an organic semiconductor compound as claimed in claim 1, wherein a film thickness of the liquid film of the organic solvent is from 100 nm to 100 µm.

6. The method of producing a single-crystal thin film of an organic semiconductor compound as claimed in claim 1, wherein the organic semiconductor compound is an aromatic hydrocarbon, a thiophene derivative, or an organometallic complex having a semiconductor characteristic.

7. The method of producing a single-crystal thin film of an organic semiconductor compound as claimed in claim 1, wherein the supplying of the organic semiconductor compound to the liquid film of the organic solvent is conducted by any one of vapor deposition, sputtering, or spraying by an electro-spraying method in the state of a solution.

8. The method of producing a single-crystal thin film of an organic semiconductor compound as claimed in claim 1, wherein a temperature in the crystallizing step is 0° C. or lower.

9. The method of producing a single-crystal thin film of an organic semiconductor compound as claimed in claim 1, wherein a contact angle of the organic solvent with respect to the substrate is 30 degrees or less.

10. The method of producing a single-crystal thin film of an organic semiconductor compound as claimed in claim 1, wherein the substrate has a function for controlling orientation.

11. The method of producing a single-crystal thin film of an organic semiconductor compound as claimed in claim 1, wherein the substrate is a substrate on which a polyimide film is provided.

12. The method of producing a single-crystal thin film of an organic semiconductor compound as claimed in claim 11, wherein the polyimide film is subjected to rubbing.

13. The method of producing a single-crystal thin film of an organic semiconductor compound as claimed in claim 1, wherein the substrate is a substrate on which a polyvinyl alcohol or (meth)acrylic resin is provided.

14. A single-crystal thin film of an organic semiconductor compound, which is prepared according to the method as claimed in claim 1.

15. A method of producing a transistor, comprising:
   producing a single-crystal thin film of an organic semiconductor compound, on a substrate, by the method which comprises the steps of:
      applying an organic solvent which has a dielectric constant of 4.5 or greater and in which the organic semiconductor compound is soluble, on a substrate on which a source electrode and a drain electrode are provided, to form a liquid film of the organic solvent on the substrate;
      supplying the organic semiconductor compound into the liquid film of the organic solvent, to dissolve therein; and crystallizing the organic semiconductor compound in the organic solvent; and providing a gate electrode, (a) on the single-crystal thin film of the organic semiconductor compound, or (b) on one surface of the substrate opposite to the other surface on which the single-crystal thin film of the organic semiconductor compound is formed.

* * * * *